(12) United States Patent
Paseuth et al.

(10) Patent No.: US 9,381,575 B2
(45) Date of Patent: Jul. 5, 2016

(54) SURFACE-COATED CUTTING TOOL AND METHOD OF MANUFACTURING THE SAME

(75) Inventors: Anongsack Paseuth, Itami (JP); Susumu Okuno, Itami (JP); Hideaki Kanaoka, Itami (JP); Erika Iwai, Itami (JP); Takahiro Ichikawa, Itami (JP)

(73) Assignee: SUMITOMO ELECTRIC HARDMETAL CORP., Itami-shi (JP)

( * ) Notice: Subject to any disclaimer, the term of this patent is extended or adjusted under 35 U.S.C. 154(b) by 0 days.

(21) Appl. No.: 14/378,087

(22) PCT Filed: Aug. 10, 2012

(86) PCT No.: PCT/JP2012/070501
§ 371 (c)(1),
(2), (4) Date: Aug. 11, 2014

(87) PCT Pub. No.: WO2013/128673
PCT Pub. Date: Sep. 6, 2013

(65) Prior Publication Data
US 2015/0037612 A1    Feb. 5, 2015

(30) Foreign Application Priority Data
Feb. 27, 2012  (JP) .................................. 2012-039853

(51) Int. Cl.
B23B 27/14      (2006.01)
C23C 16/38      (2006.01)
C23C 16/06      (2006.01)
C23C 16/44      (2006.01)

(52) U.S. Cl.
CPC .............. *B23B 27/148* (2013.01); *C23C 16/06* (2013.01); *C23C 16/38* (2013.01); *C23C 16/44* (2013.01); *B23B 2224/00* (2013.01)

(58) Field of Classification Search
USPC .............. 51/307, 309; 428/325, 704; 427/255
See application file for complete search history.

(56) References Cited

U.S. PATENT DOCUMENTS

| | | | |
|---|---|---|---|
| 4,019,873 A | 4/1977 | Reiter | |
| 4,239,536 A | 12/1980 | Yamamoto et al. | |
| 5,173,328 A | 12/1992 | Reiter et al. | |
| 5,587,233 A | 12/1996 | König et al. | |
| 6,770,358 B2 * | 8/2004 | Berger .................. | C23C 14/067 428/704 |
| 2003/0039867 A1 | 2/2003 | Berger et al. | |
| 2004/0016329 A1 | 1/2004 | Holzschuh | |
| 2006/0222894 A1 | 10/2006 | Bjormander et al. | |
| 2009/0169910 A1 | 7/2009 | Myrtveit | |
| 2010/0279093 A1 | 11/2010 | Wallgram et al. | |
| 2011/0262233 A1 | 10/2011 | Martensson | |

FOREIGN PATENT DOCUMENTS

| | | | |
|---|---|---|---|
| CN | 1836811 A | | 9/2006 |
| CN | 101463461 A | | 6/2009 |
| GB | 1408294 | | 10/1975 |
| JP | 51-148713 A | | 12/1976 |
| JP | 54-74816 A | | 6/1979 |
| JP | 03-064472 | * | 3/1991 |
| JP | H03-188262 A | | 8/1991 |
| JP | 05-16031 A | | 1/1993 |
| JP | 07-505442 A | | 6/1995 |
| JP | 2926439 B2 | | 7/1999 |
| JP | 2002-355704 A | | 12/2002 |
| JP | 2003-165003 A | | 6/2003 |
| JP | 2004-001215 A | | 1/2004 |
| JP | 2008-238281 | * | 10/2008 |
| JP | 2011-505261 A | | 2/2011 |

OTHER PUBLICATIONS

Panich et al "Effect of sun=bstrate rotation on structure, hardness and adhesion of magnetron sputtered TiB2 coating on high speed steel", Thin Solid Films 500 (2006) p. 190-196.*
Pfohl et al "Development of titanium diboride coatings deposited by PACVD" Surface & Coatings Techn 131 (2000) p. 141-146.*
Kelesoglu et al., "Microstructure and properties of nitride and diboride hard coatings deposited under intense mild-energy ion bombardment," Surface and Coatings Technology, vol. 116, pp. 133-140, Sep. 1, 1999.
Pierson et al., "Titanium Diboride Coatings and their Interaction with the Substrates," Thin Solid Films, vol. 54, No. 1, pp. 119-128, Oct. 1, 1978.
Takahashi et al., "Ultrasonic Chemical Vapor Deposition of TiB2 Thick Films," Journal of Crystal Growth, vol. 49, No. 3, pp. 445-450, Jul. 1, 1980.
Extended European Search Report for European Patent Application No. 12869786.9, dated Jul. 29, 2015.
Caputo et al., "Chemical Vapor Deposition of Erosion-Resistant TiB$_2$ Coating," Solid-State Science and Technology, J. Electrochem. Soc., Sep. 1985, pp. 2274-2280.
International Search Report in PCT International Application No. PCT/JP2012/070501, dated Oct. 30, 2012.
Notification of the First Office Action in Chinese Patent Application No. 2012800702338, dated Jul. 28, 2015.
Notice of Grounds of Rejection in Japanese Patent Application No. 2014-501951, mailed Feb. 2, 2016.

* cited by examiner

*Primary Examiner* — A. A. Turner
(74) *Attorney, Agent, or Firm* — Venable LLP; Michael A. Sartori; F. Brock Riggs

(57) ABSTRACT

A surface-coated cutting tool of the present invention includes a base material and a coating film formed on the base material. The coating film includes at least one TiB$_2$ layer. The TiB$_2$ layer has TC (100) that shows a maximum value in an orientation index TC (hkl), or has a ratio I (100)/I (101) of 1.2 or more between an X-ray diffraction intensity I (100) of a (100) plane and an X-ray diffraction intensity I (101) of a (101) plane.

2 Claims, No Drawings

SURFACE-COATED CUTTING TOOL AND METHOD OF MANUFACTURING THE SAME

TECHNICAL FIELD

The present invention relates to a surface-coated cutting tool including a base material and a coating film formed on the base material, and a method of manufacturing the surface-coated cutting tool.

BACKGROUND ART

Conventionally, there is a known surface-coated cutting tool including a base material and a coating film formed on the base material, in which a $TiB_2$ layer is included as the coating film.

For example, Japanese Patent Laying-Open No. 51-148713 (PTD 1) discloses a wear-resistant molding member comprising a cemented carbide base body and a surface layer that is formed of two laminated partial layers including an outer partial layer made of aluminum oxide and/or zirconium oxide, and an inner partial layer made of one or more types of borides, particularly, diboride that is an element of titanium, zirconium, hafnium or the like (that is, a $TiB_2$ layer).

The inner partial layer of the above-described surface layer forms a $TiB_2$ layer of 3 μm that is obtained under high-temperature and high-vacuum conditions of 1000° C. and 50 torr by introducing hydrogen at 1900l/hour, $TiCl_4$ at 20 ml/hour and $BCl_3$ at 4 g/hour each as reactive raw material gas, and forming a film for one hour. Also, the outer partial layer forms an aluminum oxide layer of 5 μm.

However, under the high-temperature and high-vacuum conditions during the film formation as mentioned above, diffusion of boron in a junction layer and a $TiB_2$ layer into the cemented carbide base body causes production of a strong η layer and/or a boron-containing brittle layer, thereby significantly reducing the lifetime of this wear-resistant molding member.

For the purpose of solving the above-described problems, a coated product is proposed that is improved in wear resistance by suppressing diffusion of boron and finely granulating $TiB_2$ in the $TiB_2$ layer (Japanese Patent National Publication No. 2011-505261 (PTD 2)). This coated product is formed by coating the surface of the cemented carbide base material with a layer of 0.1 μm to 3 μm made of a group of titanium nitride, titanium carbonitride and titanium boron carbonitride, and then, forming a $TiB_2$ layer of 1 μm to 5 μm. The conditions of forming the $TiB_2$ layer of various layers mentioned above are as follows. Specifically, a $TiB_2$ layer having a thickness of 2.5 μm is formed by the thermal CVD method for 1 hour at a standard pressure and at a temperature of 800° C., using a raw material gas composition including 10% by volume of hydrogen, 0.4% by volume of $TiCl_4$, 0.7% by volume of $BCl_3$, and 88.9% by volume of argon gas. In this coated product, a boron-containing brittle layer caused by diffusion of boron into the cemented carbide base material is not formed, and the particle size of $TiB_2$ in the $TiB_2$ layer is also controlled to be 50 nm or lower, so that the lifetime of the tool is improved to some extent.

CITATION LIST

Patent Document

PTD 1: Japanese Patent Laying-Open No. 51-148713
PTD 2: Japanese Patent National Publication No. 2011-505261

SUMMARY OF INVENTION

Technical Problem

As described above, the coated product in PTD 2 is improved in lifetime of the tool to some extent. However, attention is paid only on suppression of formation of a strong η layer and/or a boron-containing brittle layer, or on control of the particle size of $TiB_2$ in the $TiB_2$ layer. Accordingly, there are limitations in further improving the performance of the $TiB_2$ layer, so that consideration from another point of view has been required.

Furthermore, as in the case where such a coated product is used to process a Ti-based alloy that is a difficult-to-cut material, particularly in the process in which the temperature of the cutting edge tends to rise, and in the process in which the cutting edge of the tool tends to undergo stress concentration and vibration due to the specific shape of scraps (saw-blade shape), further improvement in performance such as improvement in chipping resistance has been required due to adhering and chipping of the cutting edge.

The present invention has been made in light of the above-described circumstances. An object of the present invention is to provide a surface-coated cutting tool including a $TiB_2$ layer as a coating film and highly improved in wear resistance and chipping resistance.

Solution to Problem

As a result of concentrated studies for solving the above-described problems, the inventors of the present invention have found that it is important to control the crystalline structure of the $TiB_2$ layer. Then, upon conducting further studies based on this knowledge, they completed the present invention.

Specifically, a surface-coated cutting tool according to the present invention includes a base material and a coating film formed on the base material. The coating film includes at least one $TiB_2$ layer. This $TiB_2$ layer has TC (100) that shows a maximum value in an orientation index TC (hkl), or has a ratio I (100)/I (101) of 1.2 or more between an X-ray diffraction intensity I (100) of a (100) plane and an X-ray diffraction intensity I (101) of a (101) plane.

In this case, it is preferable that the TC (100) is 3 or more.

Furthermore, the present invention also relates to a method of manufacturing a surface-coated cutting tool including a base material and a coating film formed on the base material, in which the coating film includes at least one $TiB_2$ layer. The method includes the step of forming the $TiB_2$ layer. The step is characterized by forming the $TiB_2$ layer at a film formation rate equal to or less than 1 μm/hr by a chemical vapor deposition method.

Advantageous Effects of Invention

The surface-coated cutting tool according to the present invention achieves an excellent effect of greatly improving wear resistance and chipping resistance.

DESCRIPTION OF EMBODIMENTS

The present invention will be hereinafter described in greater detail.

<Surface-Coated Cutting Tool>

The surface-coated cutting tool according to the present invention has a configuration including a base material and a coating film formed on the base material. It is preferable that such a coating film covers the entire surface of the base material. However, even if a part of the base material is not covered by this coating film or the configuration of the coating film is partially different, such a structure does not deviate from the scope of the present invention.

The above-described surface-coated cutting tool according to the present invention can be suitably used as a cutting tool such as a drill, an end mill, a cutting edge replaceable-type cutting tip for a drill, a cutting edge replaceable-type cutting tip for an end mill, a cutting edge replaceable-type cutting tip for milling, a cutting edge replaceable-type cutting tip for turning, a metal saw, a gear cutting tool, a reamer, and a tap.

<Base Material>

As the base material used for the surface-coated cutting tool according to the present invention, any material can be used as long as it is conventionally known as the above-described type of base material. For example, the base material is preferably any one of cemented carbide (for example, WC-based cemented carbide or a material containing WC and Co or carbonitride of Ti, Ta, Nb or the like), cermet (mainly composed of TiC, TiN, TiCN, or the like), high-speed steel, ceramics (titanium carbide, silicon carbide, silicon nitride, aluminum nitride, aluminum oxide, and the like), a cubic boron nitride sintered body, a diamond sintered body, and the like.

Among these various base materials, particularly, it is preferable to select WC-based cemented carbide and cermet (particularly, TiCN-based cermet). This is because these base materials are excellent in balance between the hardness and the strength particularly at a high temperature, and have excellent characteristics as a base material of the surface-coated cutting tool for the above-described use.

In the case where the surface-coated cutting tool is a cutting edge replaceable-type cutting tip or the like, the base material in this case may be those having a chip breaker or not having a chip breaker, and a cutting-edge ridgeline portion may be shaped in any of a sharp edge (a ridge in which a rake face and a flank face cross each other), honing (obtained by processing a sharp edge so as to have curve (R)), a negative land (obtained by beveling), and a combination of honing and a negative land.

<Coating Film>

The coating film of the present invention may include other layers as long as it includes at least one $TiB_2$ layer. Examples of other layers may include an $Al_2O_3$ layer, a TiN layer, a TiCN layer, a TiBNO layer, a TiCNO layer, a TiAlN layer, a TiAlCN layer, a TiAlON layer, a TiAlONC layer, and the like. In the present invention, in the case where the atomic ratio is not particularly specified in chemical formulae such as "TiN" and "TiCN", it is not assumed that the atomic ratio of each element is only "1", but assumed that all of conventionally-known atomic ratios are included.

Such a coating film according to the present invention serves to cover the base material to achieve an effect of improving several characteristics such as wear resistance and chipping resistance.

It is suitable that such a coating film of the present invention has a thickness of 3 μm to 30 μm, more preferably, 5 μm to 20 μm. When the thickness is less than 3 μm, the wear resistance may be insufficient. When the thickness exceeds 30 μm, the coating film may be peeled off or broken with great frequency when relatively strong stress is applied between the coating film and the base material during the intermittent process.

<$TiB_2$ Layer>

The $TiB_2$ layer included in the coating film of the present invention is characterized in that TC (100) shows a maximum value in an orientation index TC (hkl), or a ratio I (100)/I (101) between an X-ray diffraction intensity I (100) of a (100) plane and an X-ray diffraction intensity I (101) of a (101) plane is 1.2 or more. Due to having such a specific crystalline structure, the $TiB_2$ layer of the present invention shows an excellent effect of significantly improving wear resistance and chipping resistance. It is considered that this is because the crystalline texture of the $TiB_2$ layer exhibits specific characteristics that TC (100) shows a maximum value in orientation index TC (hkl), or the ratio I (100)/I (101) between the X-ray diffraction intensity I (100) of the (100) plane and the X-ray diffraction intensity I (101) of the (101) plane is 1.2 or more, with the result that $TiB_2$ crystals are oriented in the (100) direction with respect to the base material surface, and the hardness and the Young's modulus become superior, thereby exhibiting excellent wear resistance and chipping resistance against impacts and vibrations associated with severe cutting conditions.

In this case, the $TiB_2$ layer means a layer formed of titanium diboride ($TiB_2$). Even if this $TiB_2$ layer contains inevitable impurities and the like, it does not deviate from the scope of the present invention.

While the above-described characteristics each relate to the X-ray diffraction intensity, orientation index TC (hkl) among them is defined by the following Equation (1).

[Equation 1]

$$TC(hkl) = \frac{I(hkl)}{I_0(hkl)} \left\{ \frac{1}{n} \sum_{1}^{n} \frac{I(hkl)}{I_0(hkl)} \right\}^{-1} \quad (1)$$

In Equation (1), I (hkl) shows X-ray diffraction intensity of the (hkl) plane, and $I_0$ (hkl) shows X-ray powder diffraction intensity (standard intensity) of $TiB_2$ forming the (hkl) plane in accordance with JCPDS35-0741 (JCPDS is an abbreviation for Joint Committee on Powder Diffraction Standards (powder X-ray diffraction standards)). Furthermore, "n" in the Equation (1) shows the reflection number used for calculation, which is 8 in the present invention. It is to be noted that the used reflection (hkl) represents 8 planes including (001), (100), (101), (110), ((102)+(111)), (201), (112), and ((103)+(210)), and the braces on the right side of the Equation (1) shows the average value of these 8 planes. In addition, "((102)+(111))" means that reflections from the (102) plane and the (111) plane are in extremely close proximity to each other, and therefore, the total intensity of these two reflections is processed as one reflection. The same also applies to "((103)+(210))".

Also, the expression that "TC (100) shows a maximum value in an orientation index TC (hkl)" means that TC (100) shows a maximum value when the orientation index TC (hkl) is calculated for all of the above-mentioned 8 planes by the Equation (1). In other words, the expression indicates that crystals of $TiB_2$ are strongly oriented in the (100) plane. When the (100) plane is defined as an orientation plane in this way, the hardness and the Young's modulus become superior against impacts and vibrations associated with severe cutting conditions, which allows improvement in wear resistance and chipping resistance.

In addition, the above-described TC (100) is preferably 3 or more, and more preferably, 4 or more. This is because TC (100) of 3 or more exhibits the characteristics that the chipping resistance is particularly improved. From such a point of view, the higher TC (100) is more preferable, and accordingly, its upper limit is not particularly limited. However, it takes time to form a film of $TiB_2$ in the above-described direction, which decreases the cost advantage. Therefore, it is preferable that the upper limit is 7 or less.

The reason why the ratio I (100)/I (101) between the X-ray diffraction intensity I (100) of the (100) plane and the X-ray diffraction intensity I (101) of the (101) plane is defined separately from the above-described orientation index TC (hkl) is that, when other layers such as TiN and TiCN each are formed as a coating film of the present invention, the diffraction peak of $TiB_2$ may overlap with the diffraction peaks of these other layers, which may prevent correct evaluation of the orientation index TC (hkl).

Also in the case where this ratio I (100)/I (101) is 1.2 or more, the crystals of $TiB_2$ are strongly oriented in the (100) plane, which allows improvement in wear resistance and chipping resistance for the same reasons described above.

It is to be noted that this ratio I (100)/I (101) is 1.2 or more, more preferably 2 or more, and further more preferably 3 or more. From the point of view as described above, the higher ratio I (100)/I (101) is more preferable, and accordingly, its upper limit is not particularly limited. However, it takes time to form a film of $TiB_2$ in the above-described direction, which decreases the cost advantage. Therefore, it is preferable that the upper limit is 6 or less.

In addition, the characteristics regarding the X-ray diffraction intensity described above can be measured on the following conditions, for example, using an X-ray measurement apparatus (trademark: "X pert" manufactured by PANalytical).

Characteristic X-ray: Cu-Kα
Tube voltage: 45 kV
Tube current: 40 mA
Filter: Multilayer mirror
Optical system: Parallel beam method
X ray diffraction method: θ-2θ method It is suitable that such a $TiB_2$ layer of the present invention has a thickness of 1 μm to 10 μm, and more preferably 1.5 μm to 8 μm. When the thickness is less than 1 μm, the $TiB_2$ layer may not be able to sufficiently exert wear resistance in the continuous process. When the thickness exceeds 10 μm, chipping resistance may not be stabilized in intermittent cutting.

In addition, the particle size of the crystal grain of $TiB_2$ forming the $TiB_2$ layer is not particularly limited, but preferably approximately 0.01 μm to 1 μm.

<Other Layers>

The coating film of the present invention can include other layers as well as the $TiB_2$ layer described above. Examples of such other layers may include, but are not limited to, an underlying layer made of TiN, TiC, TiBN and the like and formed directly above the base material for further enhancing adherence between the base material and the coating film, a TiCN layer formed between such an underlying layer and the $TiB_2$ layer for enhancing adherence therebetween, an $Al_2O_3$ layer formed on the $TiB_2$ layer for enhancing oxidation resistance, an intermediate layer made of TiCNO, TiBNO and the like and formed between the $Al_2O_3$ layer and the $TiB_2$ layer for enhancing adherence therebetween, an outermost layer made of TiN, TiCN, TiC and the like and formed on the outermost surface of the coating film for indicating as to whether the cutting edge has been used or not, and the like.

The above-described other layers can generally be formed to have a thickness of 0.1 μm to 10 μm.

<Manufacturing Method>

The present invention also relates to a method of manufacturing a surface-coated cutting tool including a base material and a coating film that is formed on the base material and includes at least one $TiB_2$ layer. The manufacturing method includes the step of forming the $TiB_2$ layer. This step is characterized by forming the $TiB_2$ layer by the chemical vapor deposition method at the film formation rate equal to or lower than 1 μm/hr. In other words, the $TiB_2$ layer of the present invention described above can be formed by this manufacturing method.

In this way, according to the manufacturing method of the present invention, the film formation rate for forming the $TiB_2$ layer is set so as to achieve a thickness of 1 μm or less per hour (that is, equal to or less than 1 μm/hr), thereby allowing formation of the structure of the characteristic $TiB_2$ layer as described above. The detailed mechanism is not yet solved as to why the $TiB_2$ layer is configured to have a characteristic structure as described above by employing the above-described conditions. It is, however, surmised that this is because when the crystals of the $TiB_2$ layer grow, these crystals are preferentially oriented in (100) in order to minimize the influence of lattice strains of the underlying base material and other layers made of TIN, TiCN and the like.

When more specifically explaining the above-described manufacturing method, the raw material gas (which is also referred to as reaction gas) to be used can be $TiCl_4$, $BCl_3$, $H_2$, and Ar. The volume ratio $TiCl_4/BCl_3$ between $TiCl_4$ and $BCl_3$ is preferably 2.0 or more, and more preferably 3.0 or more. This is because the volume ratio less than 2.0 may cause a decrease in orientation index TC (100). Furthermore, it is preferable that $H_2$ in the raw material gas is set at about 50% by volume to 80% by volume, and Ar is set at about 15% by volume to 50% by volume. In other words, $H_2$ and Ar occupy a major part of the raw material gas in terms of volume ratio.

Furthermore, the reaction temperature is set at 800° C. to 950° C., and more preferably, at 850° C. to 900° C. When the reaction temperature is less than 800° C., it becomes difficult to form a $TiB_2$ layer having the characteristics of the present invention. When the reaction temperature exceeds 950° C., $TiB_2$ is coarsely granulated or an η layer and a boron-containing brittle layer may be generated if the base material is made of cemented carbide. In this regard, the manufacturing method of the present invention provides an excellent effect that generation of a strong η layer and a boron-containing brittle layer can be prevented.

Furthermore, adjustment of the film formation rate can be carried out by controlling the input amount of raw material gas. For example, the chemical vapor deposition apparatus used for this manufacturing method is provided therewithin with a plurality of stages of upper and lower installation mounts on which base materials for forming a coating film are placed. Each of these stages is provided with a plurality of input ports through which raw material gas is introduced. In this case, the input amount of raw material gas can be controlled by controlling the number of these input ports. Specifically, the number of these input ports is decreased to decrease the input amount of raw material gas, so that the film formation rate as described above can be achieved (the input amount of raw material gas may increase on the contrary in some of the stages in which the number of input ports is not decreased. Thus, it is preferable that a base material is placed also on the installation mount of such a stage so as to form a coating film also on this base material, thereby preventing diffusion of the raw material gas to other stages. In this case, the base material having such a coating film formed thereon is not regarded as an object of the present invention.)

When the film formation rate exceeds 1 μm/hr, the $TiB_2$ layer having targeted characteristics is not formed, so that chipping resistance is decreased. On the other hand, the lower film formation rate is more preferable. However, when the film formation rate is less than 0.1 μm/hr, a coating film may not sufficiently be formed depending on the shape of the base material, and the production efficiency is also decreased, which is economically not preferable.

With regard to the $TiB_2$ layer according to the present invention, as long as the above-described conditions are employed, other conditions such as a pressure can be employed without particularly limiting the conventionally known conditions. In addition, when the coating film of the present invention includes layers other than the $TiB_2$ layer, these layers can be formed by the conventionally known chemical vapor deposition method and physical vapor deposition method. Although the formation method thereof is not particularly limited, it is preferable to form these layers by the chemical vapor deposition method in terms of the fact that these layers can be formed consecutive with the $TiB_2$ layer within one chemical vapor deposition apparatus.

EXAMPLES

Although the present invention will be hereinafter described in greater detail with reference to Examples, the present invention is not limited thereto.

<Preparation of Base Material>

Eight types of base materials A to H shown in the following Table 1 were prepared. Specifically, the raw material powder having a blending composition shown in Table 1 was uniformly mixed, and pressurized and molded in a predetermined shape, which was then sintered at 1300° C. to 1500° C. for 1 to 2 hours, thereby achieving a base material made of cemented carbide formed in two types of shapes including CNMG120408NUJ and SEET13T3AGSN-G. In other words, two types of different shapes were prepared for each base material.

The above-described two types of shapes each are based on ISO. CNMG120408NUJ has a shape of a cutting edge replaceable-type cutting tip for turning while SEET13T3AGSN-G has a shape of a cutting edge replaceable-type cutting tip for rotary cutting (milling).

TABLE 1

| | Blending Composition (% by Mass) | | | | | | | | |
|---|---|---|---|---|---|---|---|---|---|
| | Co | Ni | TiC | TiCN | VC | $Cr_3C_2$ | NbC | TaC | WC |
| A | 4.8 | — | — | — | — | — | 0.2 | 0.4 | Remainder |
| B | 5.2 | 0.5 | — | — | — | 0.5 | — | — | Remainder |
| C | 7.5 | 0.9 | — | — | — | 0.4 | — | 0.3 | Remainder |
| D | 10.0 | — | — | — | — | — | — | 2.0 | Remainder |
| E | 7.0 | — | — | — | — | — | — | — | Remainder |
| F | 4.5 | — | 4 | — | 0.2 | — | 1 | — | Remainder |
| G | 5.0 | — | — | 1.5 | — | — | 1.5 | 2.0 | Remainder |
| H | 8.0 | — | — | — | — | — | — | 2.0 | Remainder |

<Formation of Coating Film>

The coating film was formed on the surface of the base material prepared as described above. Specifically, the base material was placed within the chemical vapor deposition apparatus to thereby form the coating film on the base material by the chemical vapor deposition method. The formation conditions of the coating film are as described in the following Tables 2 and 3. Table 2 shows the formation conditions of each layer other than the $TiB_2$ layer, and Table 3 shows the formation conditions of the $TiB_2$ layer. In addition, TiBNO and TiCNO in Table 2 each are an intermediate layer in Table 4 described later, and other compounds also correspond to layers, respectively, in Table 4 other than the $TiB_2$ layer.

Also as shown in Table 3, there are 13 types of formation conditions "a" to "i" and "w" to "z" for the $TiB_2$ layer, in which conditions "a" to "i" are the conditions in accordance with the method of the present invention while conditions "w" to "z" are the conditions in accordance with Comparative Examples (the conventional technique).

For example, the forming condition "a" shows that the raw material gas (reaction gas) having a composition including 1.0% by volume of $TiCl_4$, 0.4% by volume of $BCl_3$, 64.5% by volume of $H_2$, and 34.1% by volume of Ar was supplied into the chemical vapor deposition apparatus while adjusting the input amount thereof by the above-described method, to form a $TiB_2$ layer by the chemical vapor deposition method at a film formation rate of 0.50 μm/hr under the conditions of a pressure of 80.0 kPa and a temperature of 850° C.

In addition, each layer other than the $TiB_2$ layer shown in Table 2 was also similarly formed except that the film formation rate was not particularly precisely controlled. It is to be noted that the "remainder" in Table 2 shows that $H_2$ occupies the remainder of the raw material gas (reaction gas). Furthermore, "total gas amount" indicates the total volume flow rate at which gas is introduced into a CVD oven per unit time, assuming that the gas in the standard condition (0° C., 1 atmosphere) is ideal gas.

Furthermore, the composition of each coating film was checked by SEM-EDX (scanning electron microscope-energy dispersive X-ray spectroscopy).

<Evaluation of Characteristics of $TiB_2$ Layer>

The characteristics of the $TiB_2$ layer obtained on each of the formation conditions are shown in Table 3.

In Table 3, "I (100)/I (101)" shows the ratio I (100)/I (101) between the X-ray diffraction intensity I (100) of the (100) plane and the X-ray diffraction intensity I (101) of the (101) plane; "TC (100)" shows the numerical value of TC (100) in orientation index TC (hkl); and "TC (hkl)" shows as to which crystal plane shows a maximum value in orientation index TC (hkl).

It is to be noted that these characteristics were measured by the above-mentioned method.

TABLE 2

| | Reaction Gas Composition (% by Volume) | Film Forming Conditions | | |
|---|---|---|---|---|
| | | Pressure (kPa) | Temperature (° C.) | Total Gas Amount (L/min) |
| TiN (Underlying Layer) | $TiCl_4$ = 2.0%, $N_2$ = 39.7%, $H_2$ = Remainder | 6.7 | 915 | 60.7 |
| TiN (Outermost Layer) | $TiCl_4$ = 0.5%, $N_2$ = 41.2%, $H_2$ = Remainder | 79.8 | 980 | 50.5 |
| TiCN | $TiCl_4$ = 2.0%, $CH_3CN$ = 0.7%, $H_2$ = Remainder | 9 | 860 | 70.5 |
| TiBNO | $TiCl_4$ = 36.7%, $BCl_3$ = 0.1%, CO = 1.6%, $CO_2$ = 1.7%, $N_2$ = 61.7%, $H_2$ = Remainder | 6.7 | 980 | 65.5 |
| TiCNO | $TiCl_4$ = 2.1%, CO = 3.2%, $CH_4$ = 2.8%, $N_2$ = 23.7%, $H_2$ = Remainder | 16.0 | 1030 | 56.8 |
| $Al_2O_3$ | $AlCl_3$ = 1.6%, $CO_2$ = 4.5%, $H_2S$ = 0.2%, HCl = 3.5%, $H_2$ = Remainder | 6.7 | 1000 | 51.2 |

TABLE 3

| | | Reaction Gas Composition (% by Volume) | Film Forming Conditions | | Film Formation | Characteristics of $TiB_2$ layer | | |
|---|---|---|---|---|---|---|---|---|
| | | | Pressure (kPa) | Temperature (° C.) | Rate (μm/hr) | T (100)/ T (101) | TC (100) | TC (hkl) |
| The Present Invention | a | $TiCl_4$ = 1.0%, $BCl_3$ = 0.4%, $H_2$ = 64.5%, Ar = 34.1% | 80.0 | 850 | 0.50 | 4.0 | 5.0 | (100) |
| | b | $TiCl_4$ = 2.0%, $BCl_3$ = 0.4%, $H_2$ = 63.8%, Ar = 33.8% | 97.0 | 900 | 0.87 | 3.0 | 4.2 | (100) |
| | c | $TiCl_4$ = 2.0%, $BCl_3$ = 1.0%, $H_2$ = 70.3%, Ar = 26.7% | 90.0 | 830 | 0.36 | 4.4 | 5.5 | (100) |
| | d | $TiCl_4$ = 1.2%, $BCl_3$ = 0.1%, $H_2$ = 80.3%, Ar = 18.4% | 85.0 | 880 | 0.65 | 3.9 | 4.9 | (100) |
| | e | $TiCl_4$ = 1.9%, $BCl_3$ = 0.2%, $H_2$ = 51.6%, Ar = 46.3% | 87.0 | 800 | 0.20 | 4.8 | 6.0 | (100) |
| | f | $TiCl_4$ = 1.4%, $BCl_3$ = 0.6%, $H_2$ = 58.9%, Ar = 39.1% | 92.0 | 820 | 0.33 | 4.6 | 5.5 | (100) |
| | g | $TiCl_4$ = 1.9%, $BCl_3$ = 0.2%, $H_2$ = 51.6%, Ar = 46.5% | 95.0 | 860 | 0.75 | 3.2 | 4.2 | (100) |
| | h | $TiCl_4$ = 2.6%, $BCl_3$ = 1.3%, $H_2$ = 90.6%, Ar = 5.5% | 98.0 | 840 | 0.70 | 1.5 | 3.6 | (100) |
| | i | $TiCl_4$ = 2.5%, $BCl_3$ = 3.7%, $H_2$ = 83.0%, Ar = 10.8% | 98.0 | 820 | 0.95 | 1.2 | 2.8 | (100) |
| Comparative Example | w | $TiCl_4$ = 1.2%, $BCl_3$ = 1.2%, $H_2$ = 78.3%, Ar = 19.3% | 101.3 | 900 | 1.10 | 0.9 | 2.4 | (101) |
| | x | $TiCl_4$ = 0.4%, $BCl_3$ = 0.7%, $H_2$ = 10%, Ar = 88.9% | 101.3 | 800 | 1.47 | 0.3 | 2.2 | (101) |
| | y | $TiCl_4$ = 0.22%, $BCl_3$ = 0.04%, $H_2$ = 99.74% | 101.3 | 1000 | 2.54 | 0.1 | 1.9 | (101) |
| | z | $TiCl_4$ = 0.8%, $BCl_3$ = 1.6%, $H_2$ = 15.8%, Ar = 81.8% | 101.3 | 850 | 1.70 | 0.3 | 2.0 | (101) |

<Production of Surface-Coated Cutting Tool>

A coating film was formed on a base material by the conditions in Tables 2 and 3 shown above, thereby producing surface-coated cutting tools (two types of cutting edge replaceable-type cutting tips for each coating film) of Examples 1 to 22 and Comparative Examples 1 to 8 shown in the following Table 4.

For example, the table shows that the surface-coated cutting tool of Example 4 has a configuration, in which base material F shown in Table 1 was employed as a base material, to form a TiN layer having a thickness of 0.5 μm as an underlying layer on the surface of base material F under the conditions shown in Table 2, on which a TiCN layer having a thickness of 5.0 μm was formed under the conditions shown in Table 2, on which a $TiB_2$ layer having a thickness of 2.7 μm was formed under the forming condition "g" in Table 3, on which a TiBNO layer having a thickness of 0.5 μm as an intermediate layer, an $Al_2O_3$ layer having a thickness of 2.5 μm and a TiN layer having a thickness of 1.0 μm as an outermost layer were formed in this order under the conditions shown in Table 2, to thereby form a coating film having a total thickness of 12.2 μm on the base material. According to the $TiB_2$ layer of the surface-coated cutting tool of this Example 4, TC (100) shows a maximum value in orientation index TC (hkl), the numerical value is 4.2, and the ratio I (100)/I (101) is 3.2.

In addition, since all of the $TiB_2$ layers of Comparative Examples 1 to 8 are formed under the conditions of the conventional technique that is not based on the method of the present invention, these $TiB_2$ layers are to be formed of the crystalline structure which does not show characteristics similar to those of the present invention (see Table 3).

It is to be noted that each of blank columns in Table 4 shows that the relevant layer is not formed.

TABLE 4

| | | Configuration of Coating Film | | | | | | |
|---|---|---|---|---|---|---|---|---|
| | Type of Base Material | Underlying Layer (TiN layer) (μm) | TiCN Layer (μm) | $TiB_2$ layer (μm) | Intermediate Layer (μm) | $Al_2O_3$ layer (μm) | Outermost Layer (TiN Layer) (μm) | Total Thickness of Coating Film (μm) |
| Example 1 | E | 1.5 | — | b(3.5) | — | — | — | 5.0 |
| Example 2 | B | 1.3 | — | e(7.0) | — | — | — | 8.3 |

TABLE 4-continued

| | Type of Base Material | Underlying Layer (TiN layer) (μm) | TiCN Layer (μm) | TiB$_2$ layer (μm) | Intermediate Layer (μm) | Al$_2$O$_3$ layer (μm) | Outermost Layer (TiN Layer) (μm) | Total Thickness of Coating Film (μm) |
|---|---|---|---|---|---|---|---|---|
| Example 3 | A | 0.6 | 3.2 | f(3.0) | — | — | 0.5 | 7.3 |
| Example 4 | F | 0.5 | 5.0 | g(2.7) | TiBNO(0.5) | 2.5 | 1.0 | 12.2 |
| Example 5 | H | 0.5 | 1.7 | c(2.5) | TiBNO(0.5) | 1.0 | — | 6.2 |
| Example 6 | B | 0.3 | 3.6 | a(4.2) | TiBNO(0.3) | 2.5 | — | 10.9 |
| Example 7 | A | 0.6 | 2.4 | f(5.0) | TiBNO(0.5) | 1.2 | — | 9.7 |
| Example 8 | D | 0.9 | 2.4 | b(1.7) | TiBNO(0.5) | 1.4 | — | 6.9 |
| Example 9 | E | 0.7 | 1.4 | c(3.5) | TiBNO(0.5) | 1.0 | — | 7.1 |
| Example 10 | F | 0.5 | 2.6 | a(5.2) | TiBNO(0.3) | 1.5 | — | 10.1 |
| Example 11 | E | 1.2 | — | g(5.0) | TiCNO(0.6) | 2.6 | — | 9.4 |
| Example 12 | D | 1.0 | 2.4 | b(1.5) | TiBNO(0.6) | 1.2 | — | 6.7 |
| Example 13 | F | 0.5 | — | a(6.7) | TiBNO(0.7) | 3.2 | — | 11.1 |
| Example 14 | H | 0.5 | 1.2 | c(3.7) | TiBNO(0.5) | 0.8 | — | 6.7 |
| Example 15 | D | 1.5 | — | c(3.7) | TiBNO(0.5) | 1.8 | — | 7.5 |
| Example 16 | B | 1.3 | — | e(5.3) | TiBNO(0.6) | 2.8 | — | 10.0 |
| Example 17 | A | 0.7 | 6.0 | c(3.5) | TiBNO(0.5) | 3.0 | — | 13.7 |
| Example 18 | H | 1.5 | — | g(4.7) | — | — | — | 6.2 |
| Example 19 | D | 0.5 | 1.5 | d(1.8) | TiBNO(0.6) | 3.6 | 1.0 | 9.0 |
| Example 20 | D | 1.5 | — | g(4.2) | — | — | — | 5.7 |
| Example 21 | A | 1.5 | — | h(2.5) | — | — | — | 4.0 |
| Example 22 | D | 1.0 | — | i(4.0) | — | — | — | 5.0 |
| Comparative Example 1 | E | 1.5 | — | x(2.7) | — | — | 1.2 | 4.2 |
| Comparative Example 2 | F | 1.5 | 3.7 | y(3.0) | TiBNO(0.5) | 3.2 | 1.0 | 12.9 |
| Comparative Example 3 | B | 1.0 | — | x(6.7) | TiBNO(0.5) | 2.1 | 1.2 | 11.5 |
| Comparative Example 4 | D | 0.8 | 1.0 | y(3.5) | TiCNO(1.0) | 0.8 | — | 7.1 |
| Comparative Example 5 | H | 0.6 | 5.0 | y(3.5) | TiBNO(0.5) | 3.5 | — | 13.1 |
| Comparative Example 6 | D | 0.6 | 2.8 | z(3.0) | TiBNO(0.4) | 2.0 | — | 8.8 |
| Comparative Example 7 | E | 1.5 | — | z(5.0) | TiCNO(0.6) | 3.0 | — | 10.1 |
| Comparative Example 8 | B | 1.5 | — | w(4.0) | — | — | — | 5.5 |

<Cutting Test>

The surface-coated cutting tools obtained as described above were used to perform four types of cutting tests as described below.

<Cutting Test 1>

With regard to each of the surface-coated cutting tools (those having a shape of CNMG120408NUJ were used) of Examples and Comparative Examples shown in the following Table 5, the cutting time until the wear amount of the flank face (Vb) reached 0.25 mm under the following cutting conditions was measured, and the final damage state of the cutting edge was observed. The results thereof are shown in Table 5. The results show that the longer the cutting time is, the more the wear resistance is excellent. Furthermore, the results also show that the more the final damage state is close to the state of normal wear, the more the chipping resistance is excellent.

<Cutting Conditions>

Workpiece: cutting outer periphery of Ti6Al4V round bar
Circumferential speed: 75 m/min
Feeding speed: 0.3 mm/rev
Cutting amount: 2.0 mm
Cutting fluid: existing

TABLE 5

| | Cutting Time (Minute) | Final Damage State |
|---|---|---|
| Example 1 | 16.0 | Normal Wear |
| Example 2 | 20.0 | Normal Wear |
| Example 3 | 19.0 | Normal Wear |
| Example 7 | 22.0 | Normal Wear |
| Example 16 | 18.0 | Normal Wear |
| Example 21 | 19.0 | Normal Wear |
| Comparative Example 1 | 7.0 | Micro-Chipping of Front boundary |
| Comparative Example 3 | 10.0 | Normal Wear |
| Comparative Example 8 | 13.0 | Chipping |

As can be seen from Table 5, it is apparent that the surface-coated cutting tools of Examples of the present invention are excellent both in wear resistance and chipping resistance as compared to the surface-coated cutting tools of Comparative Examples.

Furthermore, in the final damage state in Table 5, "normal wear" means a damage state caused only by wearing without occurrence of chipping, breakage and the like (having a smooth wearing surface), "micro-chipping of front boundary" means an extremely small chipped portion occurring in the cutting edge portion forming a finished surface, and "chipping" means a small chipped portion occurring in the cutting edge portion.

<Cutting Test 2>

With regard to each of the surface-coated cutting tools (those having a shape of CNMG120408NUJ were used) of Examples and Comparative Examples shown in the following Table 6, the cutting time until the wear amount of the flank face (Vb) reached 0.25 mm under the following cutting conditions was measured, and the final damage state of the cutting edge was observed. The results thereof are shown in Table 6. The results show that the longer the cutting time is, the more the wear resistance is excellent. The results also show that the more the final damage state is close to the state of normal wear, the more the chipping resistance is excellent.

<Cutting Conditions>

Workpiece: cutting outer periphery of INCONEL 718 round bar
Circumferential speed: 50 m/min
Feeding speed: 0.3 mm/rev
Cutting amount: 3.0 mm
Cutting fluid: existing

TABLE 6

|  | Cutting Time (Minute) | Final Damage State |
| --- | --- | --- |
| Example 4 | 35.0 | Normal Wear |
| Example 6 | 38.0 | Normal Wear |
| Example 10 | 30.0 | Micro-Breakage of Front boundary |
| Example 13 | 42.0 | Normal Wear |
| Example 17 | 39.0 | Normal Wear |
| Comparative Example 2 | 17.0 | Micro-Chipping of Front boundary |

As can be seen from Table 6, it is apparent that the surface-coated cutting tools of Examples of the present invention are excellent both in wear resistance and chipping resistance as compared to the surface-coated cutting tools of Comparative Examples.

In the final damage state in Table 6, "normal wear" means a damage state caused only by wearing without occurrence of chipping, breakage and the like (having a smooth wearing surface), "micro-breakage of front boundary" means an extremely small chipped portion occurring in the cutting edge portion forming a finished surface in which the base material is recognized as being exposed, and "micro-chipping of front boundary" means an extremely small chipped portion occurring in the cutting edge portion forming a finished surface.

<Cutting Test 3>

With regard to each of the surface-coated cutting tools (those having a shape of SEET13T3AGSN-G were used) of Examples and Comparative Examples shown in the following Table 7, the pass frequency and the cutting distance until the breakage occurred or the wear amount of the flank face (Vb) reached 0.25 mm under the following cutting conditions were measured, and the final damage state of the cutting edge was observed. The results thereof are shown in Table 7.

In addition, the pass frequency is the repeated number of times of the operation repeatedly performed, in which one side surface (a surface of 300 mm×80 mm) of the workpiece described below (shape: a plate of 300 mm×100 mm×80 mm) is rotary cut from its one end to the other end by a cutter attached with one surface-coated cutting tool (cutting edge replaceable-type cutting tip) (it is to be noted that the pass frequency having a number with a decimal point indicates that the above-mentioned conditions are satisfied in the middle of the course from one end to the other end). In addition, the cutting distance means the total distance of the workpiece that has been cut until the above-described conditions were satisfied, and corresponds to the product of the pass frequency and the length of the side surface mentioned above (300 mm).

The results show that the greater the pass frequency is (that is, the longer the cutting distance is), the more the wear resistance is excellent. Furthermore, the results also show that the more the final damage state is close to the state of normal wear, the more the chipping resistance is excellent.

<Cutting Conditions>

Workpiece: Ti6Al4V block material
Circumferential speed: 50 m/min
Feeding speed: 0.15 mm/s
Cutting amount: 2.0 mm
Cutting fluid: existing
Cutter: WGC4160R (manufactured by Sumitomo Electric Hardmetal Corp.)
Number of attached tips: 1

TABLE 7

|  | Pass Frequency | Cutting Distance (m) | Final Damage State |
| --- | --- | --- | --- |
| Example 5 | 12.0 | 3.6 | Normal Wear |
| Example 12 | 9.8 | 2.9 | Normal Wear |
| Example 14 | 8.0 | 2.4 | Breakage |
| Example 15 | 11.8 | 3.5 | Normal Wear |
| Example 20 | 13.0 | 3.9 | Normal Wear |
| Comparative Example 4 | 3.7 | 1.1 | Breakage |
| Comparative Example 6 | 5.0 | 1.5 | Normal Wear |

As can be seen from Table 7, it is apparent that the surface-coated cutting tools of Examples of the present invention are excellent both in wear resistance and chipping resistance as compared to the surface-coated cutting tools of Comparative Examples.

In addition, in the final damage state in Table 7, "normal wear" means a damage state caused only by wearing without occurrence of chipping, breakage and the like (having a smooth wearing surface), and "breakage" means a large chipped portion occurring in the cutting edge portion.

<Cutting Test 4>

With regard to each of the surface-coated cutting tools (those having a shape of SEET13T3AGSN-G were used) of Examples and Comparative Examples shown in the following Table 8, the pass frequency and the cutting distance until the breakage occurred or the wear amount of the flank face (Vb) reached 0.25 mm under the following cutting conditions were measured, and the final damage state of the cutting edge was observed. The results thereof are shown in Table 8.

In addition, as in Cutting Test 3, the pass frequency is the repeated number of times of the operation repeatedly performed, in which one side surface (a surface of 300 mm×80 mm) of the workpiece described below (shape: a plate of 300 mm×100 mm×80 mm) is rotary cut from its one end to the other end by a cutter attached with one surface-coated cutting tool (cutting edge replaceable-type cutting tip) (it is to be noted that the pass frequency having a number with a decimal point indicates that the above-mentioned conditions are satisfied in the middle of the course from one end to the other end). As in Cutting Test 3, the cutting distance also means the total distance of the workpiece that has been cut until the above-described conditions were satisfied, and corresponds to the product of the pass frequency and the length of the side surface mentioned above (300 mm).

The results show that the greater the pass frequency is (that is, the longer the cutting distance is), the more the wear resistance is excellent. Furthermore, the results also show that the more the final damage state is close to the state of normal wear, the more the chipping resistance is excellent.

<Cutting Conditions>
Workpiece: SUS304 block material
Circumferential speed: 150 m/min
Feeding speed: 0.15 mm/s
Cutting amount: 2 mm
Cutting fluid: existing
Cutter: WGC4160R (manufactured by Sumitomo Electric Hardmetal Corp.)
Number of attached tips: 1

TABLE 8

|  | Pass Frequency | Cutting Distance (m) | Final Damage State |
|---|---|---|---|
| Example 8 | 8.0 | 2.4 | Normal Wear |
| Example 9 | 7.5 | 2.3 | Normal Wear |
| Example 11 | 9.0 | 2.7 | Normal Wear |
| Example 18 | 7.8 | 2.3 | Normal Wear |
| Example 19 | 8.0 | 2.4 | Normal Wear |
| Example 22 | 6.5 | 2.0 | Normal Wear |
| Comparative Example 5 | 1.5 | 0.5 | Breakage |
| Comparative Example 7 | 3.0 | 0.9 | Normal Wear |

As can be seen from Table 8, it is apparent that the surface-coated cutting tools of Examples of the present invention are excellent both in wear resistance and chipping resistance as compared to the surface-coated cutting tools of Comparative Examples.

In addition, in the final damage state in Table 8, "normal wear" means a damage state caused only by wearing without occurrence of chipping, breakage and the like (having a smooth wearing surface), and "breakage" means a large chipped portion occurring in the cutting edge portion.

Although the embodiments and examples of the present invention have been explained as described above, it is also intended from the beginning to combine the configurations of the above-described embodiments and examples as appropriate.

It should be understood that the embodiments and examples disclosed herein are illustrative and non-restrictive in every respect. The scope of the present invention is defined by the terms of the claims, rather than the description above, and is intended to include any modifications within the meaning and scope equivalent to the terms of the claims.

The invention claimed is:

1. A surface-coated cutting tool comprising:
   a base material; and
   a coating film formed on said base material,
   said coating film including at least one $TiB_2$ layer, and
   said $TiB_2$ layer having TC (100) that shows a maximum value in an orientation index TC (hkl), or having a ratio I (100)/I (101) of 1.2 or more between an X-ray diffraction intensity I (100) of a (100) plane and an X-ray diffraction intensity I (101) of a (101) plane.

2. The surface-coated cutting tool according to claim 1, wherein said TC (100) is 3 or more.

* * * * *